(12) United States Patent
Hendricks et al.

(10) Patent No.: US 7,655,539 B2
(45) Date of Patent: Feb. 2, 2010

(54) DICE BY GRIND FOR BACK SURFACE METALLIZED DIES

(75) Inventors: Craig Hendricks, West Valley City, UT (US); Eric Woolsey, Draper, UT (US); Jim Murphy, South Jordan, UT (US)

(73) Assignee: Fairchild Semiconductor Corporation DE (US)

( * ) Notice: Subject to any disclaimer, the term of this patent is extended or adjusted under 35 U.S.C. 154(b) by 0 days.

(21) Appl. No.: 12/103,878

(22) Filed: Apr. 16, 2008

(65) Prior Publication Data

US 2009/0261388 A1    Oct. 22, 2009

(51) Int. Cl.
*H01L 21/78* (2006.01)
(52) U.S. Cl. .................. 438/460; 438/113; 438/427; 438/462; 438/464; 438/626; 257/620; 257/787; 257/E23.179; 257/E23.116; 257/E21.599
(58) Field of Classification Search .............. 438/113, 438/427, 428, 454, 460–465, 626, 737; 257/620, 257/787, E23.179, E23.116, E21.599
See application file for complete search history.

(56) References Cited

U.S. PATENT DOCUMENTS

| 6,465,344 B1 * | 10/2002 | Barton ................ 438/626 |
| 6,642,127 B2 | 11/2003 | Kumar et al. |
| 2007/0087524 A1 * | 4/2007 | Montgomery ........... 438/427 |

* cited by examiner

*Primary Examiner*—Victor A Mandala
*Assistant Examiner*—Whitney Moore
(74) *Attorney, Agent, or Firm*—Kenneth E. Horton; Kirton & McConkie

(57) ABSTRACT

Semiconductor device processing and methods for dicing a semiconductor wafer into a plurality of individual dies that can have back surface metallization are described. The methods comprise providing a wafer with pre-diced streets in the wafer's front surface, applying a sidewall masking mechanism to the front surface of the wafer so as to substantially fill the pre-diced streets, thinning the back surface of the wafer so as to dice the wafer (e.g., by grinding, etching, or both) and expose a portion of the sidewall masking mechanism from the back surface of the wafer, and applying a material, such as metal, to the back surface of the diced wafer. These methods can prevent the metal from being deposited on die sidewalls and may allow the separation of individual dies without causing the metal to peel from the back surface of one or more adjacent dies. Other embodiments are also described.

23 Claims, 4 Drawing Sheets

DICE BY GRIND FOR BACK SURFACE METALLIZED DIES

FIELD

This application relates generally to semiconductor wafer processing. More specifically, this application discusses methods for dicing a semiconductor wafer into a plurality of individual dies that can have metal deposited on the back surface of the dies. These methods can prevent the metal from being deposited on die sidewalls and may allow the separation of individual dies without causing the metal to peel from the back surface of one or more adjacent dies.

BACKGROUND

As part of semiconductor device processing, a number of integrated circuits ("IC" or "ICs") are formed on a wafer, or substrate, made from a semiconductive material, such as silicon. Generally, ICs are formed with layers of materials that have semiconductive, conductive, and/or insulative properties. These materials are deposited, doped, etched, or otherwise used to form ICs in individual regions on the wafer that are called die or dies.

After the formation of ICs on the wafer, the wafer can be diced so as to separate individual dies from one another. The separated dies can then be used with larger circuits in either a packaged or an unpackaged form. The wafer dicing process can be accomplished in a variety of ways, including through a scribing, a sawing, or a dicing process.

In scribing, a diamond-tipped scribe is typically used to form shallow scratches in the wafer along pre-formed scribed lines that extend along the spaces (or streets) between the dies and across a surface of the wafer. After scribing, pressure can be applied to the wafer so as to separate or break the dies along the scribed lines. In sawing, a high-speed diamond-tipped saw is often used to cut the wafer along the streets. In a dicing process, grooves are typically formed along the streets in a front surface of the wafer (or the side of the wafer on which the ICs are located) and a back surface of the wafer is removed (e.g., by grinding) until either the grooves are exposed and the wafer is diced or until the wafer is thin enough that it can be separated by the application of pressure.

However, these dicing processes typically have several shortcomings. For example, chips and gouges are often formed along the edges of dies that are separated by scribing or sawing. Similarly, scribing and sawing may cause cracks to form and propagate from the edges of the dies into the substrate so as to render the substrate inoperable and thereby reduce the die yield. To prevent the damage caused by cracking or chipping from spreading to one or more ICs, additional spacing may be required between the dies. Likewise, because some saw blades can be relatively wide, even more spacing may be required between dies on wafers that are diced by sawing. This additional space between dies can result in wasted wafer space and a lower number of dies produced from each wafer.

Additionally, some dicing processes may have shortcomings when used with wafers that have metal deposited on their back surfaces (back surface metallization). For example, the dicing process may leave the sidewalls of the individual dies exposed during the metallization process. Accordingly, metal may be allowed to be deposit on the sidewalls of the die, causing the die to short circuit during use. Moreover, the removal of an individual die from a diced wafer with back surface metallization may cause the metal on the back surface of one or more adjacent dies to be peeled away from the adjacent dies.

SUMMARY

This application relates to semiconductor device processing and methods for dicing a semiconductor wafer into a plurality of individual dies that can have back surface metallization. The methods comprise providing a wafer with pre-diced streets in the wafer's front surface, applying a sidewall masking mechanism to the front surface of the wafer so as to substantially fill the pre-diced streets, thinning the back surface of the wafer so as to dice the wafer (e.g., by grinding, etching, or both) and expose a portion of the sidewall masking mechanism from the back surface of the wafer, and applying a material, such as metal, to the back surface of the diced wafer. These methods can prevent the metal from being deposited on die sidewalls and may allow the separation of individual dies without causing the metal to peel from the back surface of one or more adjacent dies.

BRIEF DESCRIPTION OF THE DRAWINGS

The following description can be better understood in light of the Figures, in which.

Figure 1:
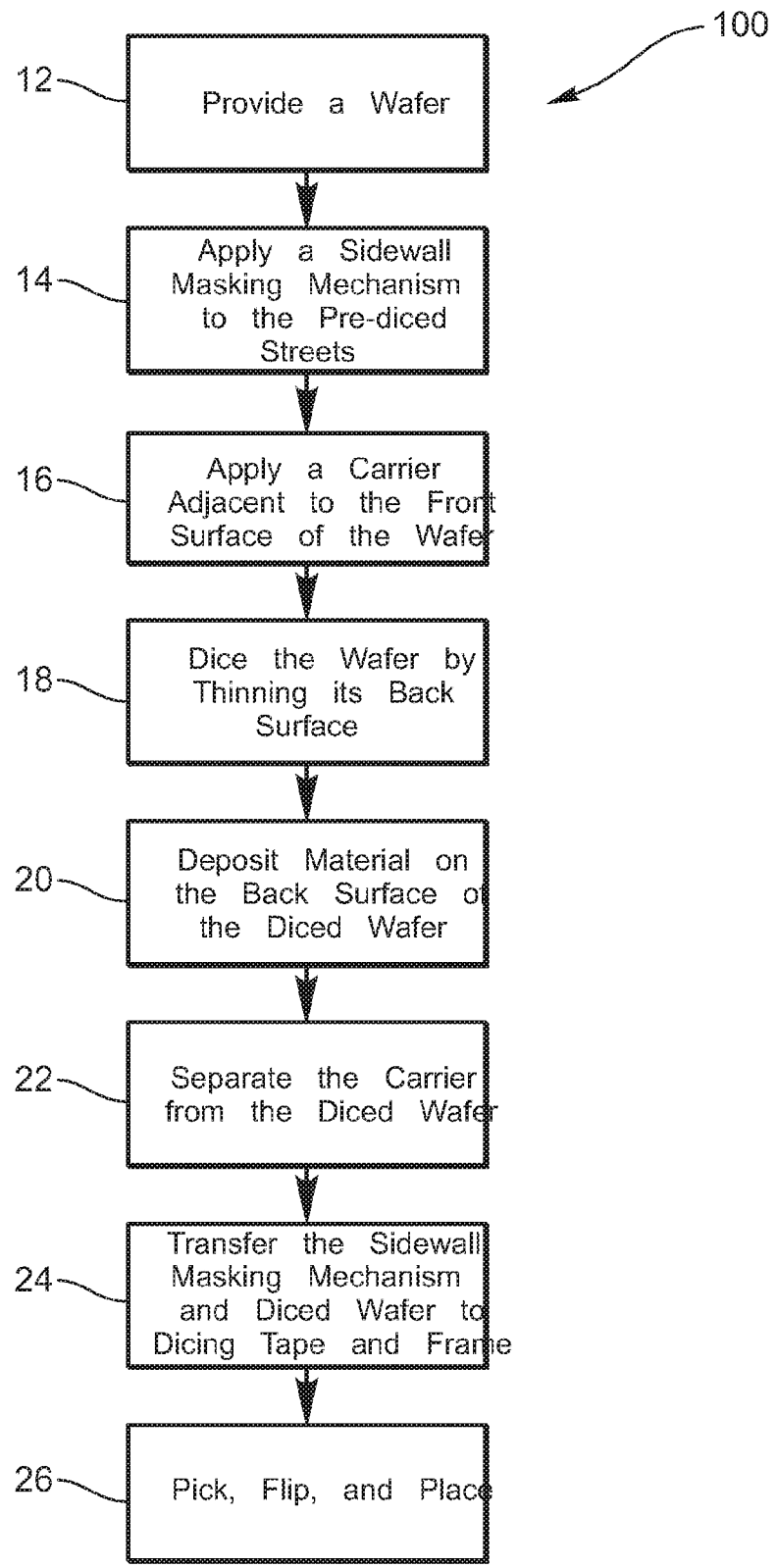
FIGS. 1 shows some embodiments of a method for dicing a semiconductor wafer.

The Figures illustrate specific aspects of the methods for dicing a semiconductor wafer. Together with the following description, the Figures demonstrate and explain the principles of the described methods and dies produced through the described methods. In the drawings, the thickness of layers and regions are exaggerated for clarity. It will also be understood that when a layer, component, or substrate is referred to as being "on" another layer, component, or substrate, it can be directly on the other layer, component, or substrate, or intervening layers may also be present. The same reference numerals in different drawings represent the same element, and thus their descriptions will not be repeated.

DETAILED DESCRIPTION

The following description supplies specific details in order to provide a thorough understanding. Nevertheless, the skilled artisan would understand that the described methods for dicing a semiconductor wafer can be implemented and used without employing these specific details. For example, while the detailed description focuses on using methods with metal-oxide-semiconductor field-effect transistors ("MOSFET") that comprise a back side drain, the described methods can be used with any semiconductor die containing any material used in semiconductor devices. And while the methods may be used for processing thin substrate devices, or substrate devices with a thickness of about 0.1 millimeters or less (e.g., about 0.01 millimeters), the methods could be applied to substrates with a larger thickness ranging up to about 0.8 millimeters, or even larger.

This application discusses methods for dicing a semiconductor wafer into a plurality of individual dies that can have back surface metallization. Some embodiments of these methods are shown in the Figures. Beginning with those embodiments shown in FIG. 1, at box 12 the methods 10 begin by providing a wafer 100. The wafer can have any characteristic suitable for use with the described methods. For example, the wafer may comprise any semiconductor material that is suitable for use as a substrate in the production of individual dies. Some non-limiting examples of suitable semi-conductive materials can comprise silicon, gallium arsenide, germanium, and so forth.

Figure 2:
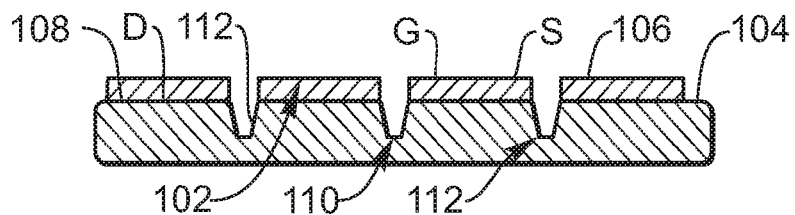
FIGS. 2-7 illustrate some embodiments of a wafer at various stages in the described methods for dicing a semiconductor wafer.

FIG. 2 shows that the wafer 100 may comprise a plurality of ICs 102 disposed on a front surface 104 of the wafer 100. In such embodiments, the ICs 102 can comprise any semiconductor component that can be contained on a die. By way of non-limiting example, the ICs 102 can comprise at least one gate G, source S, and/or drain D. While the gate, source, and/or drain may be configured on the IC in any suitable manner, FIG. 2 illustrates some embodiments where the gate G and source S are located on a front side 106 of the ICs 102 and the drain D is located on the back side 108 of the ICs 102.

FIG. 2 shows that the front surface 104 of the wafer 100 can comprise pre-diced streets 110, or trenches that extend into and only partially penetrate the wafer 100 from the front surface 104. Typically, the pre-diced streets are located between individual dies and are designed as locations along which the wafer will be diced. The pre-diced streets can be formed in any suitable manner, including the use of scribing, chemical etching, plasma etching, and/or any other known method for forming trenches that partially penetrate the wafer. For instance, FIG. 2 illustrates that the wafer 100 can have pre-diced streets 110 that are formed by scribing.

In some embodiments, FIG. 1 at box 14 shows that a sidewall masking mechanism is applied to the front surface of the wafer so as to substantially fill the pre-diced streets. As discussed herein, the sidewall masking mechanism can serve many purposes, such as protecting the ICs during wafer processing, protecting the sidewalls 112 of the individual dies from debris or metal deposition during wafer processing, preventing metal deposited on the back surface of the dies from forming a continuous sheet across multiple dies, and/or attaching the wafer to a surface on a carrier, dicing tape, and/or a frame.

The sidewall masking mechanism can comprise any material that is suitable to both protect the sidewalls from material deposited on the back surface of the dies and to prevent the deposited material from forming a continuous sheet across multiple dies. By way of non-limiting example, the sidewall masking mechanism can comprise an adhesive, a plastic, a polymer, a photoresist, a thermal paste, or combinations thereof.

Figure 3:
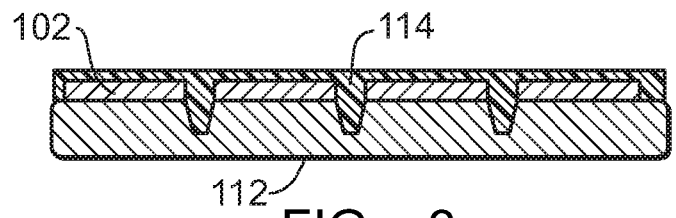

In some embodiments, the sidewall masking mechanism comprises an adhesive that is applied to the front surface of the wafer. By way of illustration, FIG. 3 shows that the adhesive 114 can cover at least a portion of one or more ICs 102 and substantially fill the pre-diced streets 110. In these embodiments, the adhesive may comprise any material that is resistant to a wafer etching and that is suitable to temporarily adhere to a die and another surface (e.g., the carrier 116 described below). For example, the adhesive may comprise a liquid adhesive, a paste adhesive, or combinations thereof. Indeed, in some embodiments, the adhesive comprises any adhesive that can be applied as a liquid and then converted to a solid. One example of such an adhesive includes a resin.

Figure 4:
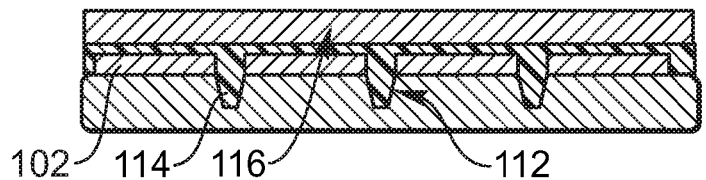

Method 10 continues at box 16 when a carrier is applied adjacent to the front surface of the wafer. By way of example, FIG. 4 shows that a carrier 116 can be placed on the adhesive 114 that is on the ICs 102 and the sidewalls 112. The carrier may have any characteristic that allows it to support the wafer and be used with the described methods. For instance, the carrier can be fabricated of glass, PYREX®, silicon, or other materials that are compatible with the dicing processes used. Additionally, while the carrier can have any suitable form, in some embodiments the carrier has a form factor that is similar to the wafer to be diced. In such embodiments, conventional wafer handling robotics may be used to move the carrier in the same manner as a semiconductor wafer.

The carrier can be attached to the wafer using any known process. For example, an adhesive can be applied between the sidewall masking mechanism and the carrier, or, as mentioned above, the sidewall masking mechanism can contain an adhesive. Where the sidewall masking mechanism comprises an adhesive, the carrier can be adapted to be used with the adhesive. For instance, where the adhesive is applied to the wafer as a liquid that can be converted into a solid through the use of ultra violet light, the carrier can be a glass or another transparent or semi-transparent material.

The method 10 continues at box 18 when the wafer is diced by removing a portion of the wafer's back surface. In such embodiments, a portion of the back surface can be removed and the wafer can be thinned and/or diced using any known process. For instance, a portion of the back surface of the wafer can be removed through grinding, etching, and/or both grinding and etching.

Figure 5:
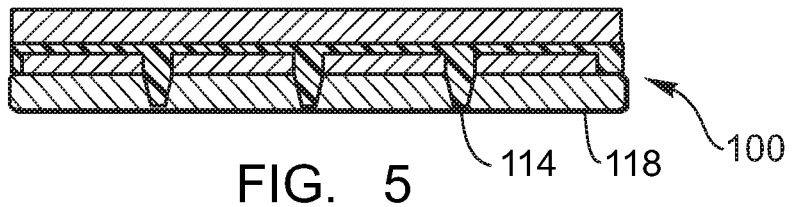
Figure 6:
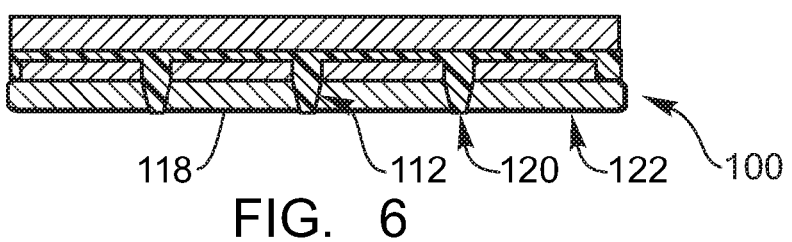

FIGS. 5 and 6, respectively, show some embodiments where a portion of the back surface 118 of the wafer 100 is removed first by grinding and then by etching. Specifically, FIG. 5 shows some embodiments where the wafer 100 is thinned through any known back-grinding process. In such embodiments, any desired amount of the back surface of the wafer can be ground. For example, the back surface of the wafer can be ground until a portion of the sidewall masking mechanism (e.g., the adhesive 114) is exposed from the back surface of the wafer. However, in another example, FIG. 5 shows the back surface 118 of the wafer 100 can be ground so that the sidewall masking mechanism (e.g., the adhesive 114) is not exposed from the back surface 118.

Where the back surface of the wafer is ground, the back surface can be ground until the wafer has any desired thickness. In one example, the back surface of the wafer may ground so that the wafer is thinned to a thickness anywhere from about 0.1 micrometer (em) to about 100 µm of the final wafer target thickness. In another example, the wafer can be ground to within about 1 µm and about 20 µm of the final wafer target thickness. In still another example, however, the wafer can be ground to within about 5 µm and about 10 µm of the final wafer target thickness.

FIG. 6 shows that, in some embodiments, the back surface of the wafer is thinned to the final wafer target thickness through etching. In such embodiments, FIG. 6 illustrates that the etching process may remove a portion of the back surface 118 so as to allow a portion of the sidewall masking mechanism (e.g., adhesive 114) to extend from the back surface 118 of the diced wafer 100 and form an elevated step 120. In such embodiments, the elevated step can extend any distance from the back surface of the wafer that allows the step to prevent material deposited on the back surface of the wafer from forming a continuous sheet across multiple dies, as described below. For instance, the elevated step may extend from about 5 μm to about 25 μm above the back surface of the diced wafer.

Where the back surface of the wafer is thinned to its final target thickness through etching, the wafer can be etched in any suitable way that allows the sidewall masking mechanism to form an elevated step between dies. For example, the back surface of the wafer can be etched through chemical etching (e.g., wet etching with a silicon etching chemical, such as potassium hydroxide) or plasma etching (e.g., etching with a reactive gas capable of etching silicon, such as $SF_6$, $C_4F_8$, $CHF_3$, and/or $XeF_2$).

After the wafer has been diced and the individual dies are separated, the method continues at box 20 when a material is deposited on the back surface of the wafer. In such embodiments, any material suitable for deposition on the back surface of the wafer can be deposited on the wafer. Some non-limiting examples of suitable materials include a metal (e.g., silver, gold, lead, nickel, platinum, titanium, tin, and/or combinations thereof (e.g., NiPdAu, TiNiAgAu, or TiNiAgSn)), an oxidation-resistant layer, or an adhesion sub-layer. A metallized back surface of the die may serve several purposes, such as improving the electrical and/or mechanical connection between the back surface of the die and another component of a semiconductor package or circuit.

Figure 7:
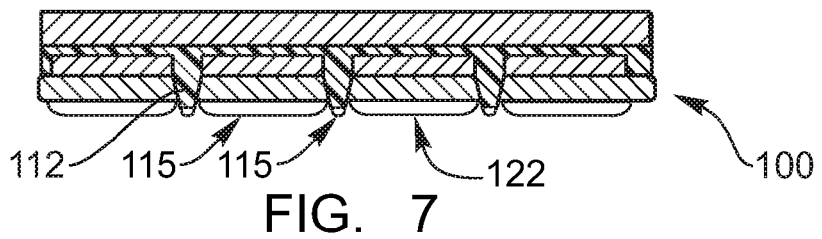

As previously mentioned, the sidewall masking mechanism can fill several roles when a material is deposited on the back surface of the diced wafer. For example, FIG. 7 shows the sidewall masking mechanism (e.g., adhesive 114) covers and protects the sidewalls 112 from having a material, such as a metal 115, deposited on them during back surface deposition. Accordingly, the adhesive can act to prevent the individual dies from shorting during use due to conductive deposits on the sidewall. In another example, FIG. 7 shows that where a portion of the sidewall masking mechanism (e.g., adhesive 114) extends from the back surface 118 of the diced wafer to form an elevated step 120 between dies 122, the elevated step 120 creates an elevated step that tends to prevent the deposited material from forming a continuous layer across multiple dies. Accordingly, the elevated step can allow an individual die to be separated without causing the deposited material (e.g., metal) to peel from one or more adjacent dies.

Figure 8:
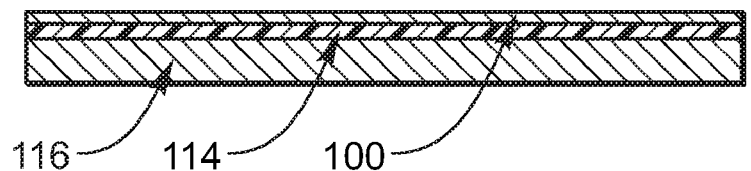
FIGS. 8 and 9 illustrate different views of some embodiments of a diced wafer on a carrier.
Figure 9:
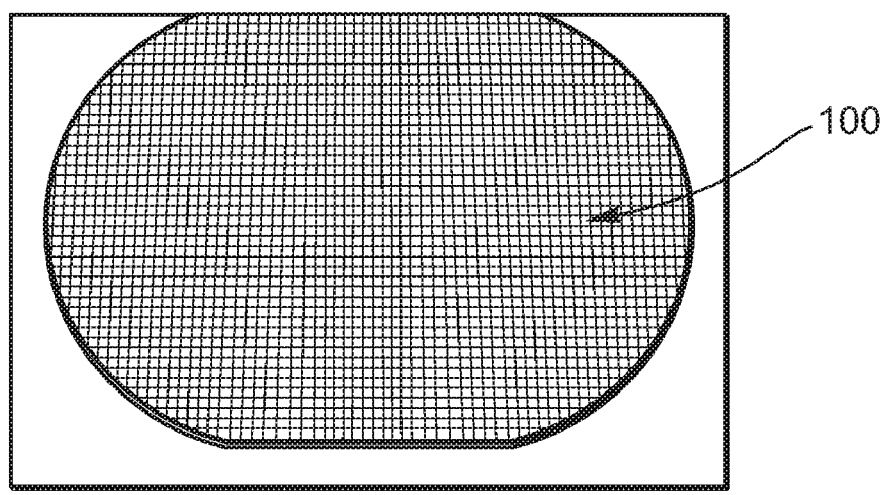
Figure 10:
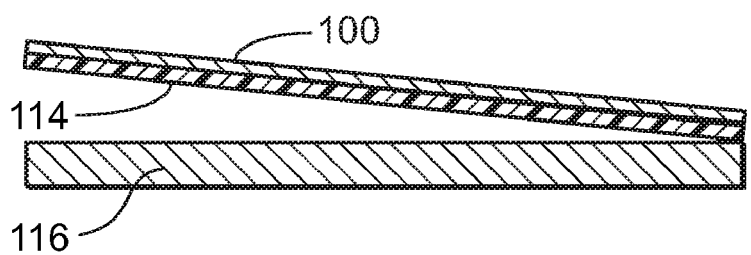
FIG. 10 illustrates some embodiments where the diced wafer is removed from the carrier.

The method 10 continues at box 22 when the diced wafer 100 on the carrier 116 (as shown in FIGS. 8 and 9) can be separated from the carrier (as shown in FIG. 10). In such embodiments, the sidewall masking mechanism (e.g., adhesive 114) can also be separated from the carrier while remaining attached to the individual dies. The carrier can then be re-used to support another semiconductor wafer that is to be diced.

Figure 11:
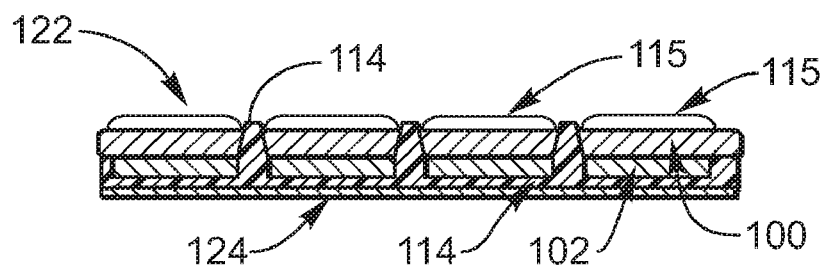
FIG. 11 illustrates some embodiments of the diced wafer mounted on dicing tape.
Figure 12:
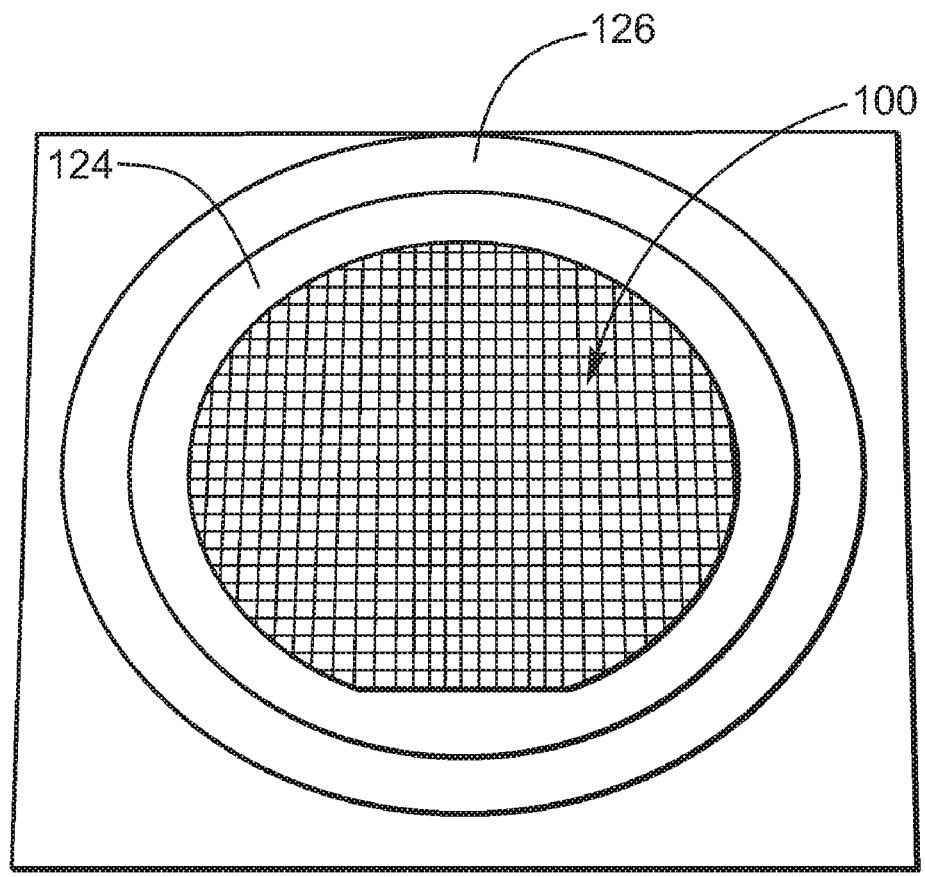
FIG. 12 illustrates some embodiments of the diced wafer on dicing tape and a frame.

Next, at box 24, the diced wafer and sidewall masking mechanism (e.g., adhesive 114) can be mounted on dicing tape and a frame. For example, FIG. 11 shows where the adhesive 114 is attached to the dicing tape 124 and the individual dies 122 are, in turn, attached to the adhesive 114. In another example, FIG. 12 shows the dicing tape 124 can be attached to a frame 126 that can support the diced wafer 100 during handling, packaging, and shipping. In some cases, the frame 126 has a form factor that is similar to the diced wafer. In such cases, wafer handling robotics may be used to move the frame in substantially the same manner as a semiconductor wafer.

Figure 13:
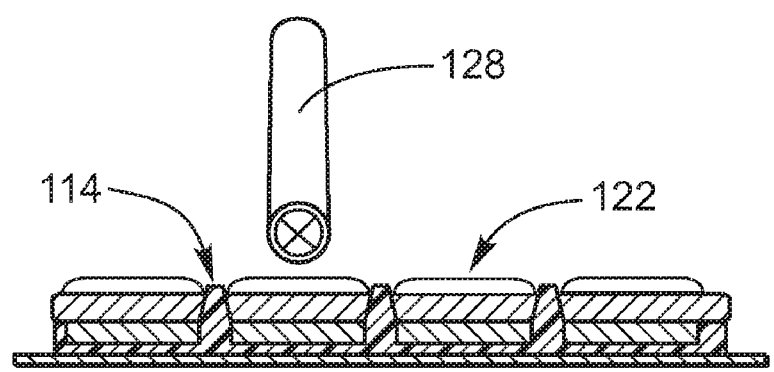
FIG. 13 illustrates some embodiments of the diced wafer where one die is being picked from the diced wafer.

The method 10 continues at box 26 where the individual dies can be picked and removed from the sidewall masking mechanism (e.g., adhesive 114) that is connected to the dicing tape and frame and the individual dies can be flipped and placed through any known or novel manner. For example, FIG. 13 shows the individual dies 122 can be picked, flipped, and/or placed by conventional pick-and-place robotic arm 128.

These methods—and the dies produced by these methods—serve several purposes. One purpose is that the sidewall masking mechanism can prevent debris and deposited materials from being deposited on the sidewalls of individual dies. Accordingly, the methods can prevent or reduce shorting in dies that have a conductive material deposited on their back surface. Another purpose is that the elevated step of the sidewall masking mechanism can create a step coverage that prevents the formation of a continuous sheet of material across the back surface of multiple dies. Thus, these methods can allow for separation of the individual dies without causing the deposited material to peel from the back surface of one or more adjacent dies. Yet these methods do not require a blade that dices by protruding through the wafer (as can be the case in sawing). As a result, these methods may can greatly reduce the chipping or cracking of the dicing region and, thereby, allow for improved die yields. These methods also allow the wafers to be diced before shipping, reducing cycle time at the assembly site. And because the wafers can be diced before shipping, the amount of shipping wafer breakage can be greatly reduced over other methods where the wafer is diced after shipping.

Having described the preferred aspects of the methods for dicing semiconductor devices, it is understood that the appended claims are not to be limited by particular details set forth in the description presented above, as many apparent variations thereof are possible without departing from the spirit or scope thereof.

The invention claimed is:

1. A method for dicing a semiconductor wafer, comprising:
providing a semiconductor wafer with a back surface and a front surface with pre-diced streets that partially penetrate the wafer;
providing a sidewall mask that substantially fills the pre-diced streets;
dicing the wafer into individual dies with sidewalls by grinding or etching a portion of the back surface of the wafer to cause a portion of the sidewall mask to extend from the back surface of the diced wafer and form an elevated step between the individual dies; and
depositing a material on the back surface of the diced wafer, wherein the sidewall mask prevents the material from being deposited on the sidewalls.

2. The method of claim 1, wherein the grinding process thins the wafer to a thickness ranging from about 0.1 micrometer and about 100 micrometers of a final wafer target thickness.

3. The method of claim 1, wherein the grinding process thins the wafer to a thickness ranging from about 1 micrometer and about 20 micrometers of the final wafer target thickness.

4. The method of claim 1, wherein the grinding process thins the wafer to a thickness ranging from about 5 micrometers and about 10 micrometers of the final wafer target thickness.

5. The method of claim 1, wherein the material deposited on the back surface of the diced wafer comprises a metal.

6. The method of claim 1, wherein the sidewall mask comprises an adhesive, a plastic, a polymer, a photoresist, a thermal paste, or combinations thereof.

7. The method of claim 1, wherein the wafer comprises a MOSFET with a drain of the MOSFET being located on the back surface of the wafer.

8. A method for dicing a semiconductor wafer, comprising:
providing a semiconductor wafer with a back surface and a front surface with pre-diced streets that partially penetrate the wafer;
applying an adhesive to the front surface of the wafer to substantially fill the pre-diced streets;
attaching a carrier to the adhesive;
dicing the wafer into individual dies with sidewalls by removing a portion of the back surface of the wafer so that a portion of the adhesive extends from the back surface of the diced wafer and forms an elevated step between the individual dies; and
depositing a metal on the back surface of the diced wafer, wherein the sidewall mask prevents the metal from being deposited on the sidewalls.

9. The method of claim 8, wherein removing the portion of the back surface comprises an etching process, a grinding process, or both.

10. The method of claim 9, wherein the grinding process thins the wafer to a thickness ranging from about 0.1 micrometer and about 100 micrometers of a final wafer target thickness.

11. The method of claim 9, wherein the grinding process thins the wafer to a thickness ranging from about 1 micrometer and about 20 micrometers of the final wafer target thickness.

12. The method of claim 9, wherein the grinding process thins the wafer to a thickness ranging from about 5 micrometers and about 10 micrometers of the final wafer target thickness.

13. The method of claim 8, wherein the elevated step prevents the deposited metal from forming a continuous layer across the back surface of the diced wafer.

14. The method of claim 8, wherein the wafer comprises a MOSFET with a drain of the MOSFET being located on the back surface of the wafer.

15. A diced semiconductor wafer produced by a method comprising:
providing a semiconductor wafer with a back surface and a front surface with pre-diced streets that partially penetrate the wafer;
applying an adhesive to the front surface of the wafer to substantially fill the pre-diced streets;
attaching a carrier to the adhesive;
dicing the wafer into individual dies with sidewalls by removing a portion of the back surface of the wafer so that a portion of the adhesive extends from the back surface of the diced wafer and forms an elevated step between the individual dies; and
depositing a metal on the back surface of the diced wafer, wherein the sidewall mask prevents the metal from being deposited on the sidewalls.

16. The diced wafer of claim 15, wherein removing the portion of the back surface comprises an etching process, a grinding process, or both.

17. The diced wafer of claim 16, wherein the grinding process thins the wafer to a thickness ranging from about 0.1 micrometer and about 100 micrometers of a final wafer target thickness.

18. The diced wafer of claim 16, wherein the grinding process thins the wafer to a thickness ranging from about 1 micrometer and about 20 micrometers of the final wafer target thickness.

19. The diced wafer of claim 16, wherein the grinding process thins the wafer to a thickness ranging from about 5 micrometers and about 10 micrometers of the final wafer target thickness.

20. The diced wafer of claim 15, wherein the elevated step prevents the deposited metal from forming a continuous layer across the back surface of the diced wafer.

21. The wafer of claim 15, wherein the wafer comprises a MOSFET with a drain of the MOSFET being located on the back surface of the wafer.

22. The method of claim 8, wherein the sidewall mask comprises an adhesive, a plastic, a polymer, a photoresist, a thermal paste, or combinations thereof.

23. The wafer of claim 15, wherein the sidewall mask comprises an adhesive, a plastic, a polymer, a photoresist, a thermal paste, or combinations thereof.

* * * * *